(12) United States Patent
Allman et al.

(10) Patent No.: US 11,355,433 B2
(45) Date of Patent: Jun. 7, 2022

(54) SEMICONDUCTOR FUSE STRUCTURE AND METHOD OF MANUFACTURING A SEMICONDUCTOR FUSE STRUCTURE

(71) Applicant: SEMICONDUCTOR COMPONENTS INDUSTRIES, LLC, Phoenix, AZ (US)

(72) Inventors: Derryl Allman, Camas, WA (US); Jefferson W. Hall, Chandler, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 73 days.

(21) Appl. No.: 16/674,739

(22) Filed: Nov. 5, 2019

(65) Prior Publication Data

US 2021/0104460 A1 Apr. 8, 2021

Related U.S. Application Data

(60) Provisional application No. 62/909,479, filed on Oct. 2, 2019.

(51) Int. Cl.
*H01L 23/525* (2006.01)
*H01L 23/522* (2006.01)
*H01L 23/528* (2006.01)
*H01L 23/00* (2006.01)

(52) U.S. Cl.
CPC ...... *H01L 23/5256* (2013.01); *H01L 23/5226* (2013.01); *H01L 23/5283* (2013.01); *H01L 23/562* (2013.01)

(58) Field of Classification Search
CPC .................................................. H01L 27/11206
See application file for complete search history.

(56) References Cited

U.S. PATENT DOCUMENTS 5,708,291 A 1/1998 Bohr et al.
6,242,790 B1 6/2001 Tsui et al.
(Continued)

OTHER PUBLICATIONS

C. Kothandaraman et al., "Electrically Programmable Fuse (eFUSE) Using Electromigration in Silicides", IEEE Electron Device Letters, vol. 23, No. 9, Sep. 2002.
(Continued)

*Primary Examiner* — Xiaoming Liu
(74) *Attorney, Agent, or Firm* — Kevin B. Jackson

(57) ABSTRACT

A semiconductor device having a fuse structure includes a region of semiconductor material having a major surface. A dielectric region is over the major surface. A first fuse terminal is over a first part of the dielectric region, a second fuse terminal is over a second part of the dielectric region and spaced apart from the first fuse terminal to provide a gap region, and a fuse body over a third part of the dielectric region interposed between and connected to the first fuse terminal and the second fuse terminal. A dummy structure is over the dielectric region in the gap region on a first side of the fuse body, the dummy structure spaced apart and electrically isolated from the fuse body, the first fuse terminal, and the second fuse terminal. The dummy structure is configured to reduce the presence of or reduce the effects of defects, such as cracks or voids that can emanate from the fuse structure.

16 Claims, 3 Drawing Sheets

(56) References Cited

U.S. PATENT DOCUMENTS

| | | | | |
|---|---|---|---|---|
| 6,271,574 B1* | 8/2001 | Delpech | ............. | H01L 23/5256 |
| | | | | 257/529 |
| 2006/0087002 A1* | 4/2006 | Miwa | .................. | H01L 23/5258 |
| | | | | 257/529 |
| 2006/0278932 A1* | 12/2006 | Kothandaraman | ......................... | |
| | | | | H01L 23/5256 |
| | | | | 257/368 |
| 2010/0148915 A1* | 6/2010 | Kuo | ................... | H01L 23/5256 |
| | | | | 337/290 |
| 2014/0319651 A1* | 10/2014 | Wu | ..................... | H01L 23/5256 |
| | | | | 257/529 |
| 2015/0067620 A1* | 3/2015 | Wu | ........................ | G06F 30/30 |
| | | | | 716/53 |

OTHER PUBLICATIONS

Nick Chen, "The Benefits of Antifuse OTP", Semiconductor Engineering, e-publication, Dec. 19, 2016.

* cited by examiner

SEMICONDUCTOR FUSE STRUCTURE AND METHOD OF MANUFACTURING A SEMICONDUCTOR FUSE STRUCTURE

CROSS-REFERENCE TO RELATED APPLICATIONS

This application claims the benefit of U.S. Provisional Patent Application No. 62/909,479, filed on Oct. 2, 2019, the entire contents of which is incorporated herein by reference.

TECHNICAL FIELD

The present disclosure relates, in general, to electronic devices, and more particularly, to semiconductor devices and methods for manufacturing semiconductor devices.

BACKGROUND

Electrically programmable fuse (eFUSE) structures have been used in semiconductor devices including as one-time programmable (OTP) elements in non-volatile memory devices. Other applications have included circuit protection and trimming of resistors, capacitors and other discrete components in analog circuits. Typically, eFUSE structures include polysilicon/silicide structures and electromigration effects have been used to change the resistance of the fuse structure from a low resistance state to a high resistance state. In this approach, the eFUSE is programmed by applying a voltage or current controlled bias across the polysilicon/silicide fuse. The silicide material and dopants within the polysilicon migrate or move by electron current and a thermal gradient from one region of the fuse structure to another thereby increasing the resistance of the fuse structure. In some applications, this change in resistance is monitored by sensing circuitry integrated within the semiconductor device. Although eFUSE structures have desirable features, such as flexible programming and simplified sensing circuitry, prior eFUSE structures have had problems affecting their use. Such problems have included high resistance excursions, which have resulted in yield loss and reliability issues.

Accordingly, it is desired to have fuse structures and methods of forming fuse structures that overcome the issues associated with prior structures. It would be beneficial for the structures and methods to be cost effective and to be easily integrated into existing semiconductor device process flows.

Figure 1:
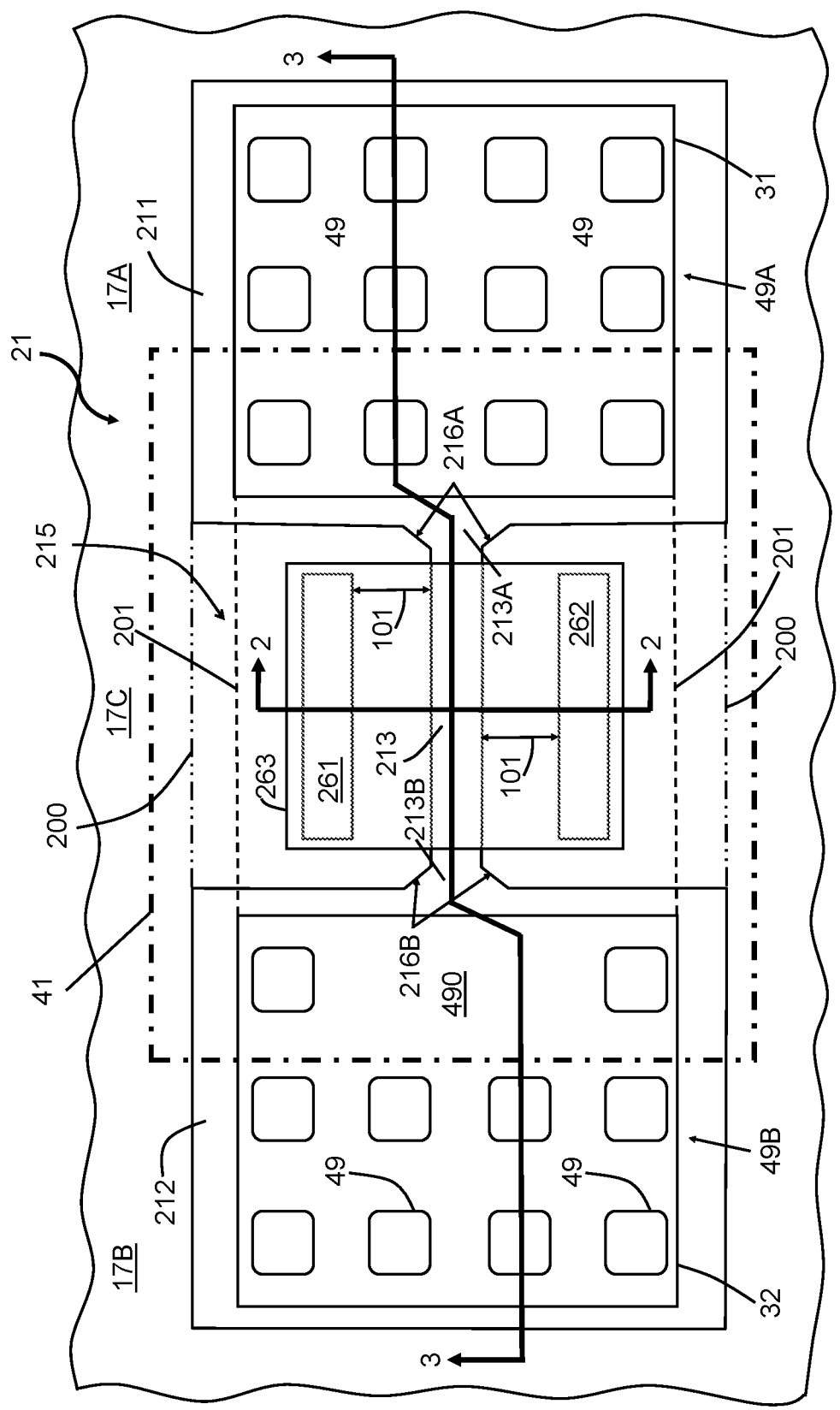
FIG. 1 illustrates a top view of a fuse structure of the present description.

For simplicity and clarity of the illustration, elements in the figures are not necessarily drawn to scale, and the same reference numbers in different figures can denote the same elements. Additionally, descriptions and details of well-known steps and elements are omitted for simplicity of the description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. As used herein, the term and/or includes any and all combinations of one or more of the associated listed items. In addition, the terminology used herein is for the purpose of describing particular example embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one example" or "an example" means that a particular feature, structure or characteristic described in connection with the embodiment is included in at least one example of the present invention. Thus, appearances of the phrases "in one example" or "in an example" in various places throughout this specification are not necessarily all referring to the same example, but in some cases it may. Furthermore, the particular features, structures or characteristics may be combined in any suitable manner, as would be apparent to one of ordinary skill in the art, in one or more example embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}. It is further understood that the examples illustrated and described hereinafter suitably may have examples and/or may be practiced in the absence of any element that is not specifically disclosed herein. Unless specified otherwise, the term "coupled" may be used to describe physical or electrical coupling of elements that directly contact each other or that are indirectly connected by one or more other elements. For example, if element A is coupled to element B, then element A can be directly contacting element B or indirectly connected to element B by an intervening element C.

DETAILED DESCRIPTION

The present description includes, among other features, semiconductor devices and associated methods that comprise fuse structures with one or more added structures configured to reduce the occurrence of and/or the effects of defects formed in the fuse structures before and after programming. The authors observed experimentally that the high resistance excursions found in prior fuse structures is caused at least in part by voids and/or cracks in the silicide film prior to programming. This high resistance results in undesirable yield reduction. Further, this often results in unsatisfactory programming including the physical destruction of the fuse structure.

In addition, the authors observed experimentally that the programming process can cause cracks in dielectric regions that are adjacent to the fuse structure. These dielectric cracks can become filled with material from the fuse structure, which is extruded into the crack due to the pressure from programming. As the dielectric crack grows, more material can be extruded into the crack if the fuse structure stress remains high. Also, the material in the dielectric crack can act like a wedge, and with thermal heating and cooling, the material locally increases stress and continues to drive crack growth. This material can provide an undesirable conductive path for electrical shorts to adjacent structures, such as logic or other circuitry and/or other fuse structures. In addition, the dielectric crack defects were observed to migrate into the substrate on which the fuse structures are formed and migrate into surrounding dielectric structures.

As a result of the above, erroneous results, functional failures, and increased leakage have occurred. It was further observed that the crack defects will continue to grow over the life of a product until the associated stress is relaxed to an energy level lower than the material strength of the dielectric and semiconductor materials surrounding the fuse structures.

In some examples described hereinafter, a fuse structure includes a pair of fuse terminals connected by a fuse body. The fuse body can comprise a semiconductor material and a silicide material. Pursuant to the present description, to resolve the difficulties noted above an auxiliary structure, such as a dummy structure is disposed adjacent to but separated from the fuse body. In other examples, dummy structures are placed on opposing sides of the fuse body. In some examples, the dummy structures are disposed within a peripheral boundary defined by the fuse terminals. In further examples, a dummy structure is disposed to laterally overlap the fuse body and can be separated from the fuse body by a dielectric structure. In still further embodiments, one or more ends of the fuse body can include flared portions where the fuse body meets the fuse terminal(s). In other examples, at least a portion of the cathode fuse terminal is provided devoid of contact structures to enhance material migration/transfer during programming. In another example, a doped well structure is provided within a region of semiconductor material below at least the fuse body of the fuse structure. In addition, the well region can be disposed below at least portions of the fuse terminals. These features were observed through experimentation to reduce the presence of and/or reduce/contain the effects of voids and cracks thereby improving yields (e.g., reducing skew in resistance data) and reliability of semiconductor products using fuse structures, such as eFUSE structures.

In one example, a semiconductor device having a fuse structure includes a region of semiconductor material having a first major surface. A dielectric region is over the first major surface. A first fuse terminal is over a first part of the first dielectric region, a second fuse terminal is over a second part of the first dielectric region and spaced apart from the first fuse terminal to provide a gap region, and a fuse body over a third part of the first dielectric region interposed between and connected to the first fuse terminal and the second fuse terminal. A first dummy structure is over the first dielectric region in the gap region on a first side of the fuse body, the first dummy structure spaced apart and electrically isolated from the fuse body, the first fuse terminal, and the second fuse terminal. In another example, a second dummy structure over the first dielectric region in the gap region on a second side of the fuse body, the second dummy structure spaced apart and electrically isolated from the fuse body, the first fuse terminal, and the second fuse terminal. In a further example, a second dielectric region is over the fuse body and the first dummy structure, and a second dummy structure is over the second dielectric region in the gap region, and the second dummy structure overlaps the fuse body.

In one example, a semiconductor device having a fuse structure, comprises a region of semiconductor material having a first major surface. A first dielectric region is over the first major surface A fuse structure is over the first dielectric region and includes a first fuse terminal over a first part of the first dielectric region, a second fuse terminal over a second part of the first dielectric region and spaced apart from the first fuse terminal to provide a gap region, and a fuse body over a third part of the first dielectric region interposed between and connected to the first fuse terminal and the second fuse terminal. A first dummy structure is over the first dielectric region in the gap region on a first side of the fuse body, the first dummy structure spaced apart and electrically isolated from the fuse body, the first fuse terminal, and the second fuse terminal. A floating doped well region is in the region of semiconductor material adjacent to the first major surface, wherein the fuse body and the first dummy structure are over the floating doped well region.

In one example, a method of forming a semiconductor device having a fuse structure, comprises providing a region of semiconductor material having a first major surface. The method includes providing a first dielectric region over the first major surface. The method includes providing a fuse structure over the first dielectric region comprising a first fuse terminal over a first part of the first dielectric region, a second fuse terminal over a second part of the first dielectric region and spaced apart from the first fuse terminal to provide a gap region, and a fuse body over a third part of the first dielectric region interposed between and connected to the first fuse terminal and the second fuse terminal. The method includes providing a first dummy structure over the first dielectric region in the gap region on a first side of the fuse body, the first dummy structure spaced apart and electrically isolated from the fuse body, the first fuse terminal, and the second fuse terminal.

Other examples are included in the present description. Such examples may be found in the figures, in the claims, and/or in the description of the present disclosure.

Figure 2:
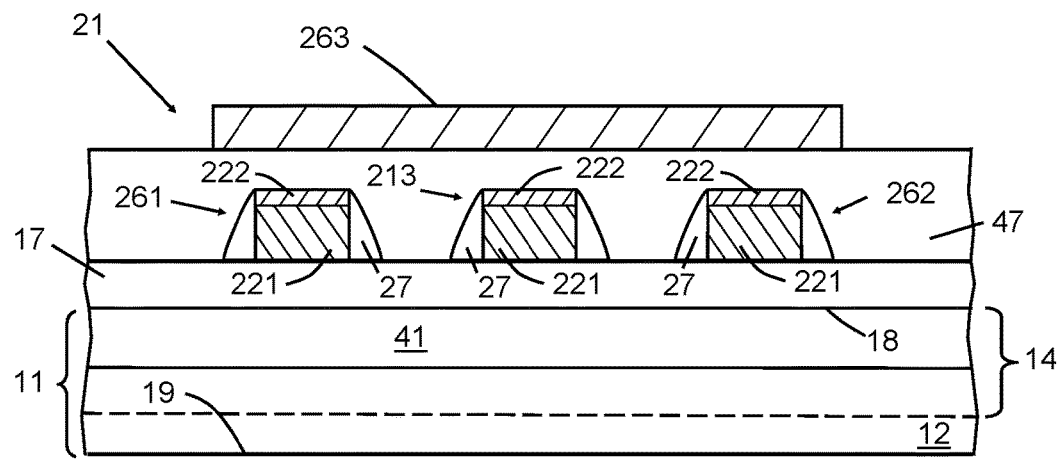
FIG. 2 illustrates a partial cross-sectional view of the fuse structure of FIG. 1 taken along reference line 2-2.
Figure 3:
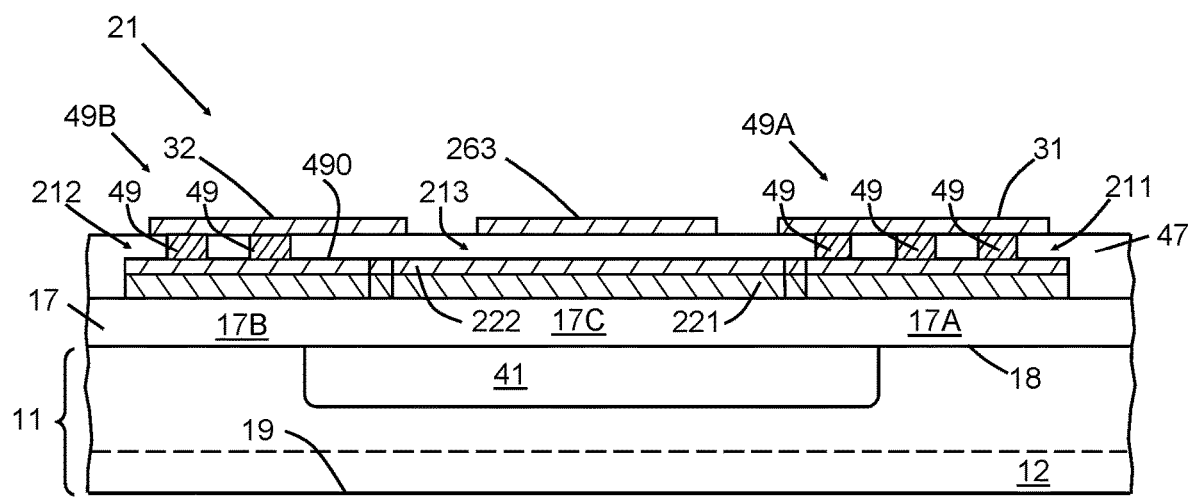
FIG. 3 illustrates a partial cross-sectional view of the fuse structure of FIG. 1 taken along reference line 3-3.

FIG. 1 illustrates a top plan view of an example electronic device 10, such as a semiconductor device 10 having a fuse structure 21 in accordance with the present description. FIG. 2 illustrates a partial cross-sectional view of semiconductor device 10 having fuse structure 21 taken along reference line 2-2 of FIG. 1, and FIG. 3 illustrates a partial cross-sectional view of semiconductor device 10 having fuse structure 21 taken along reference line 3-3 of FIG. 1. In the following description, reference may be made to all three figures.

In the present example, fuse structure 21 is provided as part of semiconductor device 10, which includes a region of semiconductor material 11. Fuse structure 21 can be one of a plurality of fuse structures 21 provided as part of semiconductor device 10. In some examples, fuse structure 21 is configured as fuse bit cell in a one-time programmable (OTP) application, but it is not limited to this application. It is understood that semiconductor device 10 can include other circuits and/or devices connected directly or indirectly with fuse structure 21, such as switching transistors, select devices, biasing devices, input devices, clock devices, etc., which are not illustrated FIGS. 1-3 so as to not distract from the present description. In some examples, region of semiconductor material 11 can be silicon, combinations of silicon with other Group IV elements, other IV-IV materials, III-V materials, semiconductor-on-insulator (SOI) materials, other materials known to one of ordinary skill in the art, or combinations thereof.

In some examples, region of semiconductor material 11 can comprises a base substrate 12, such as a silicon substrate. Region of semiconductor material 11 can further include a semiconductor layer 14, such as an epitaxial layer over a surface of base substrate 12. Semiconductor layer 14 and base substrate 12 can be different materials, can have different dopant concentrations, and/or can have different conductivity types (i.e., N-type or P-type). Region of semiconductor material 11 includes a major surface 18 and an opposing major surface 19. In some examples, region of semiconductor 11 is configured as a substrate to support complementary metal-oxide semiconductor (CMOS) or bipolar/CMOS (BiCMOS) process flows.

A dielectric region 17, a first dielectric region 17, or a dielectric structure 17 is provided over major surface 18 of region of semiconductor material 11 and can include one or more insulating materials, such as oxides (doped and/or undoped), nitrides, other insulating materials as known to one of ordinary skill in the art, or combinations thereof. Dielectric region 17 is configured to protect device regions within region of semiconductor material 11 and to separate fuse structure 21 from region of semiconductor material 11. In some examples, a planarization process, such as a chemical-mechanical planarization (CMP) process can be used to provide the uppermost surface of dielectric region 17 in a more planar configuration. Stated differently, in some examples dielectric region 17 has a substantially co-planar outermost surface. In some examples, fuse structure 21 is provided over portions of dielectric region 17. In other examples, fuse structure 21 can be provided as part of other upper interconnect layers above dielectric region 17 depending on the application requirements for semiconductor device 10. In some examples, dielectric region 17 can be a shallow trench isolation (STI) structure.

In the present example, fuse structure 21 comprises a fuse terminal 211 or first fuse terminal 211, a fuse terminal 212 or second fuse terminal 212, and a fuse body 213. Fuse terminal 211 can be configured as an anode terminal and fuse terminal 212 can be configured as a cathode terminal or vice versa. Fuse terminal 211 is over a first part 17A of dielectric region 17 and fuse terminal 212 is over a second part 17B of dielectric region 17. Fuse terminal 212 is spaced apart from fuse terminal 211 to provide a gap region 215 interposed between first terminal 211 and second terminal 212.

In some examples, fuse body 213 is over a third part 17C of dielectric region 17 interposed between and connected to first terminal 211 and second terminal 212 within gap region 215. Fuse body 213 has a narrower width compared first terminal 211 and second terminal 212. Although first terminal 211 and second terminal 212 are generally illustrated as having similar dimensions in the top view of FIG. 1, in other examples, second terminal 212 can have different dimensions than first terminal 211. In some examples, second terminal 212 can be larger than first terminal 211.

Fuse body 213 includes a first fuse body end 213A connected to first terminal 211 and second fuse body end 213B connected to second terminal 212. In some examples, one or more of fuse body end 213A and fuse body end 213B comprise flared portions 216A and 216B, which can be pairs flared portions disposed on opposite sides of fuse body 213. In this way, fuse body 213 widens in the top plan view proximate to or adjacent to where fuse body 213 connects to fuse terminals 212 and/or 211. Flared portions 216A and 216B can have a triangular shape in the top plan view where the base and height are equal to about one-half of the width of fuse body 213. It was found in practice that flared portions 216A and 216B can provide an optical correction during photolithographic processing to avoid unwanted narrowing of the width fuse body 213 where fuse body 213 connects to fuse terminals 211 and 212. In accordance with the present description, by reducing the narrowing effect of fuse body 213, flared portions 216A and 216B help reduce stress within fuse body 213 where fuse body 213 transitions to fuse terminal 211 and/or fuse terminal 212 prior to programming and/or as a result of programming. This provides for a reduction of cracking defects in fuse structure 21 213 and reduces the high resistance yield loss compared to prior devices.

In some examples, pairs of flared portions 216A and 216B comprise a taper with respect to fuse body 213 of about 30 degrees to about 60 degrees. In other examples, pairs of flared portions 216A and 216B comprise a taper with respect to fuse body 213 of about 40 degrees to about 50 degrees. In further embodiments, pairs of flared portions 216A and 216B comprise a taper with respect to fuse body 213 of about 45 degrees.

p Fuse structure 21 can comprise a semiconductor material portion 221 and a silicide portion 222. In some examples, when initially formed on dielectric region 17 (i.e., pre-programming), semiconductor material portion 221 comprises a polycrystalline semiconductor material, such as polysilicon, which can be doped P-type or N-type. In some examples, semiconductor material portion 221 is doped with boron to provide a P-type conductivity. After fuse structure 21 is programmed, all or portions of the polysilicon grains of semiconductor material portion 221 can be melted leaving behind nanocrystalline semiconductor material. Semiconductor material portion 221 can be formed using chemical vapor deposition (CVD) techniques and can be doped in-situ or after the polycrystalline semiconductor material is deposited. Ion implantation, CVD doping, atomic layer deposition doping, or other doping techniques known to one of ordinary skill in the art can be used to dope semiconductor material portion 221 if it is not doped in-situ. In some examples, semiconductor material portion 221 can have thickness in a range from about 500 Angstroms to about 8000 Angstroms. In other examples, semiconductor material portion 221 can have a thickness in a range from about 2000 Angstroms to about 3000 Angstroms. In some process flows, semiconductor material portion 221 can be formed at the same time as gate structures used in other structures within semiconductor device 10.

Silicide portion 222 of fuse structure 21 comprises one or more silicide materials. By way of example, silicide portion 222 can comprise a material that can undergo a mass transfer within fuse structure 21 during a bias condition and that is compatible with semiconductor device process flows (i.e., uses silicide materials that are used elsewhere in other structures semiconductor device 10, that minimize additional processing steps, and/or that do not introduce contaminants into the process flows). In some examples, silicide portion 222 comprises cobalt silicide, nickel silicide, titanium silicide, tungsten silicide, other silicide materials as known to one of ordinary skill in the art, or combinations thereof. Silicide portion 222 can be formed using sputtering, evaporation, or other deposition processes to deposit one or more metal materials onto semiconductor material portion 221.

When the deposited metal is cobalt, it was observed that for semiconductor material portions 221 comprising polysilicon films less than about 1500 Angstroms thick, a cobalt silicide thickness of about 1000 Angstroms can cause damage to gate oxides in adjoining structures on semiconductor device 10. In this regard, a typical deposited cobalt film can have a thickness in a range from about 50 Angstroms to about 250 Angstroms with a target thickness of about 130 Angstroms. When thicker polysilicon films are used for semiconductor material portions 221, thicker metal films can be used with such thickness being determined based on desired final resistance for the fuse structure.

In some examples, a capping film (not shown) can be provided over the deposited metals, and can comprise titanium or titanium-nitride when, for example, the silicide metal source is cobalt. The thickness of the titanium or titanium nitride capping film can range between about 50 Angstroms to about 300 Angstroms. However, when titanium is used, its thickness can affect the final cobalt silicide thickness. It has been observed that titanium can oxidize and both titanium and oxygen will first diffuse to the semiconductor layer (e.g., silicon layer) forming $Ti_xSi_y$ or $Ti_xO_ySi_z$ films, which retard the growth of the cobalt silicide films. In this regard, the titanium film thickness can be between about 50 Angstroms and 200 Angstroms with a target of about 100 Angstroms. In addition, it has been observed that titanium nitride films do not diffuse into the semiconductor layer and do not tend to retard the growth of cobalt silicide films. In this regard, the titanium nitride film thickness can be between about 50 Angstroms and 300 Angstroms with a target thickness of about 100 Angstroms.

In some examples, semiconductor material portion 221 and the deposited metal(s) can be patterned using masking and etching techniques to form fuse structure 21 after the deposited metal is provided. The one or more metal materials can then be annealed at an elevated temperature and the unreacted metal material removed to provide silicide portion 222.

In accordance with the present description, one or more dummy structures or features, such as dummy structures or features 261 and 262, are provided over dielectric region 17 in gap region 215. In accordance with the present description, dummy structures 261 and 262 are auxiliary structures configured to reduce or contain defects within fuse structure 21 during processing, prior to programming, during programming, or as a result of programming; and/or to minimize any defects or the impact thereof on other structures provided as part of semiconductor device 10. More particularly, dummy structures 261 and 262 function to confine or arrest any cracks or other defects to the area around dummy structures 261 and 262. In accordance with the present description, dummy structures 261 and 262 increase local stress in the dielectric regions (e.g., dielectric region 17 and/or dielectric region 47 described later) between fuse body 213 and dummy structures 261 and 262 because the crack tend to grow or follow the higher stress field lines. More particularly, dummy structures 261 and 262 pull the crack towards the dummy structures 261 and 262 so that the crack terminates at the interface between dielectric region and dummy structures 261 and 262. Effectively, dummy structures 261 and 262 divide the crack into multiple directions through delamination, which requires more local energy than what is present to continue to grow thereby containing the crack defect within a more localized region.

In some examples, dummy structures 261 and 262 are within a perimeter 200 defined by edges of fuse terminals 211 and 212 as generally illustrated in FIG. 1 so as to more effectively reduce defects or contain the effects thereof within fuse structure 21. In other examples, dummy structures 261 and 262 are within a perimeter 201 defined by edges of conductive contacts 31 and 32. In some examples, dummy structures 261 and 262 run generally parallel to fuse body 213 and are physically separated from fuse body 213 and fuse terminals 211 and 212.

In some examples, dummy structures 261 and 262 are not connected to other conductive structures and are electrically floating. Although dummy structures 261 and 262 are illustrated as single rectangular structures, dummy structures 261 and 262 can have other shapes, and each of dummy structures 261 and 262 can include a plurality of sub-structures of the same shape or different shapes. In some examples, dummy structures 261 and 262 comprise similar materials to fuse structure 21, and can be formed at the same time. In some examples, only one of dummy structures 261 and 262 can be used. In other examples, both dummy structures 261 and 262 are used. In other examples, additional dummy structures can be included over dielectric region 17 adjacent to dummy structures 261 and 262. Such dummy structures can be orientated similarly or differently than dummy structures 261 and 262.

In some examples, dummy structures 261 and 262 are spaced an edge-to-edge spacing 101 in a range from about 0.3 microns to about 0.7 microns. In other examples, edge-to-edge spacing 101 is about 0.5 microns. It was found in practice that this spacing helps maintain the image fidelity of fuse body 213 in applicable photolithographic processes. In some examples, dummy structures 261 and 262 are placed close to fuse body 213 to provide a stress reducing and/or containing effect, but spaced apart sufficiently so as to not impact the image fidelity during the patterning process that forms fuse structure 21 including fuse body 213.

In some examples including process flows less than about 0.5 microns, dielectric spacers 27 are disposed along sides of fuse body 213 and dummy structures 261 and 262, and can comprise oxides, nitrides, other dielectric materials as known to one of skill in the art, or combinations thereof.

In accordance with the present description, a doped region 41, well region 41, floating doped well region 41, or doped well region 41 is in region of semiconductor material 11 adjacent to major surface 18 below or underneath fuse structure 21. In some examples, well region 41 comprises N-type conductivity or P-type conductivity. More particularly, well region 41 has a conductivity type that is opposite to the conductivity type of semiconductor layer 14. For example, if semiconductor layer 14 is N-type, then well region 41 can be P-type. If semiconductor layer 14 is P-type, then well region 41 can be N-type. In some examples, well region 41 is an electrically floating region in that no direct electrical contact is made to well region 41. Stated differently, defects such as cracks contained in well region 41 are isolated from other structures within region of semiconductor material 11 by the PN junction formed between well region 41 and semiconductor layer 14. For example, if well region 41 is a P-well and semiconductor layer 14 is N-type, semiconductor layer 14 would be biased positively; if well region 41 is an N-well and semiconductor layer 14 is P-type, semiconductor layer 14 would be biased negatively.

Well region 41 extends to a depth into semiconductor layer 14 to a depth that typically is dependent on the operational voltage, transistor speed, and/or isolation to other voltage domains in region of semiconductor material 11. In some examples, well region 41 extends into semiconductor layer 14 to a depth in a range from about 0.09 microns to about 6.0 microns with a target of about 1.1 microns when well region 41 is N-type, and a target of about 0.7 microns when well region 41 is P-type. In some examples, well region 41 can be formed using ion implantation, CVD, or other doping techniques as known to one of ordinary skill in the art. In some examples when well region 41 is N-type, well region 41 can be formed using ion implantation with an implantation dose in a range from about $5.0 \times 10^{11}$ atoms/cm$^2$ to about $5.0 \times 10^{13}$ atoms/cm$^2$ with a target of about $1.0 \times 10^{13}$ atoms/cm$^2$. In some examples when well region 41 is P-type, well region 41 can be formed using ion implantation with an implantation dose in a range from about $5.0 \times 10^{11}$ atoms/cm$^2$ to about $5.0 \times 10^{13}$ atoms/cm$^2$ with a target of about $6.0 \times 10^{12}$ atoms/cm$^2$. In some examples, well region 41 has a dopant concentration greater than semiconductor layer 14. In some examples, at least fuse body 213 is within the perimeter of well region 41 as generally illustrated in FIGS. 1, 2, and 3. It was found in practice that well region 41 helps contain and electrically isolate any cracks from within fuse structure 21 from the rest of region of semiconductor material 11 thereby improving the yields and reliability of semiconductor device 10.

In some examples, a dielectric region 47, a second dielectric region 47, interlayer dielectric (ILD) 47, or a dielectric structure 47 is provided over fuse structure 21 as illustrated in FIGS. 2 and 3. Dielectric region 47 can include one or more insulating materials, such as oxides (doped and/or undoped), nitrides, other insulating materials as known to one of ordinary skill in the art, or combinations thereof. In one example, dielectric region 47 comprises a layer of nitride material and a layer of doped oxide.

In accordance with the present description, one or more dummy structures, such as a dummy structure 263, are provided over dielectric region 47 in gap region 215 and above fuse body 213. In accordance with the present description, dummy structure 263 is an auxiliary structure configured to reduce stresses within fuse structure 21 prior to programming, during programming, as a result of programming, and/or to minimize the impact of any defects on other structures provided as part of semiconductor device 10. More particularly, similar to dummy structures 261 and 262 dummy structure 263 functions to confine or arrest any cracks or other defects to the area around dummy structure 263. In some examples, dummy structure 263 comprises a plate-like structure that laterally overlaps fuse body 213 in the plan view. In one example, dummy structure 263 completely laterally overlaps fuse body 213. In other examples, dummy structure 263 laterally overlaps at least portions of dummy structures 261 and 262. In one example, dummy structure 263 completely laterally overlaps both dummy structures 261 and 262 as generally illustrated in FIGS. 1 and 2. In some examples, dummy structure 263 comprises a metal, such as aluminum, an aluminum alloy, copper, or other materials as known to one of ordinary skill in the art.

In some examples, dummy structure 263 can be formed as part of the first metal layer or metal 1 interconnect scheme for semiconductor device 10 using sputtering, evaporation, or other deposition techniques. In some examples, dummy structure 263 can be wider than dummy structures 261 and 262. In some examples, dummy structures 261 and 262 can be disposed entirely within a perimeter set by the edges of dummy structure 263 as illustrated in FIG. 1. In other examples, dummy structure 263 can comprise a plurality of sub-structures, such as a plurality of parallel striped structures of rectangular shapes or other shapes. In other examples, additional dummy structures can be included over dielectric region 47 adjacent to dummy structure 263. Such dummy structures can be orientated similarly or differently than dummy structure 263.

In some examples, conductive through-vias 49 or conductive vias 49 are formed in dielectric region 47 above fuse terminal 211 and above fuse terminal 212. Conductive vias 49 provide a structural pathway for conductive contacts 31 and 32 to electrically connect to fuse terminal 211 and fuse terminal 212 respectively. In some examples, photolithographic and etch techniques can be used to form vias through dielectric region 47. The openings are then filled with a conductive material, such as a metal, which can be planarized to provide conductive vias 49. In some examples, metals, such as tungsten can be used with barrier materials such as titanium and/or titanium nitride. Other materials as known to one of ordinary skill in the art also can be used.

Conductive vias 49 are provided as a first via pattern 49A over first fuse terminal 211, and as a second via pattern 49B over second fuse terminal 212. In accordance with the present description, second via pattern 49B is different than first via pattern 49A. In some examples, second via pattern 49B includes an area 490 that is devoid of conductive vias 49 proximate to where fuse body 213 connects to fuse terminal 212. With area 490 devoid of conductive vias 49, a region of larger area is provided as a source from which material (e.g., mixture silicide metal such as cobalt, semiconductor material, oxygen, and nitrogen) can migrate uninterrupted through fuse body 213. It was found in practice that this feature helps reduce skew in preprogramming resistance data and reduce excursions in post-programming resistance data due to interruptions that would be present otherwise. With the exception of area 490 devoid of conductive vias 49, the other conductive vias are placed in first via pattern 49A and second via pattern 49B to provide a more uniform current distribution across fuse terminal 211 and fuse terminal 212 during programming.

It is understood that in accordance with the present description, fuse structures can include one or more and any combination of the auxiliary structures or features described herein.

In one analysis, multiple wafers with a fuse structure 21 including dummy structures 262, 262, and 263 and well region 41 were compared to multiple control wafers with a fuse structure not including any dummy features or a well region. Fuse resistance was measured preprogramming with nominal target of 70 Ohms. The fuse structures comprises polysilicon with a cobalt silicide annealed at temperatures including 750, 775, 800, and 850 degrees Celsius. With respect to the 850 degrees Celsius samples, 15 out of 15 of the control wafers had fuse structures with resistance values of over 1500 Ohms, while only 1 wafer out of 15 of the wafers having fuse structures 21 had a resistance value over 1500 Ohms. This is a significant improvement over prior fuse structures.

Figure 4B:
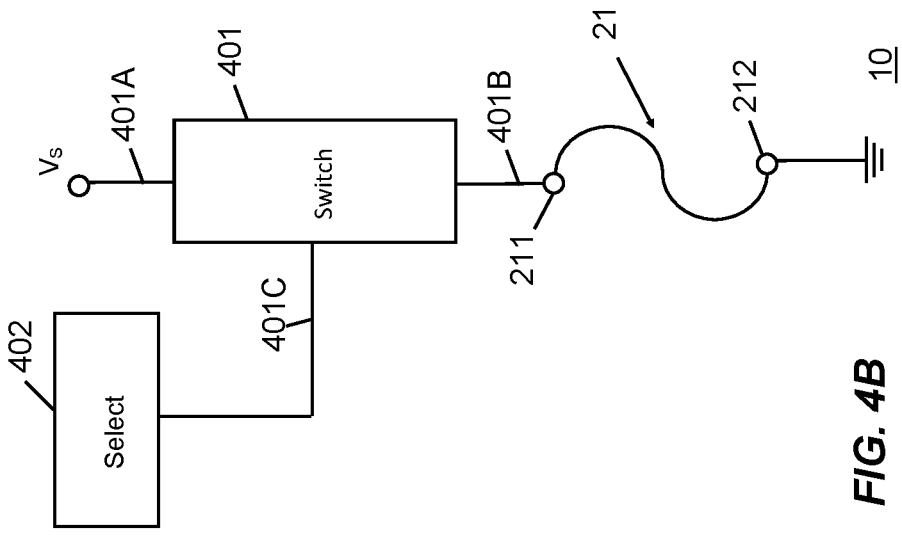
FIG. 4B is a schematic of a circuit incorporating a fuse structure of the present description.
Figure 4A:
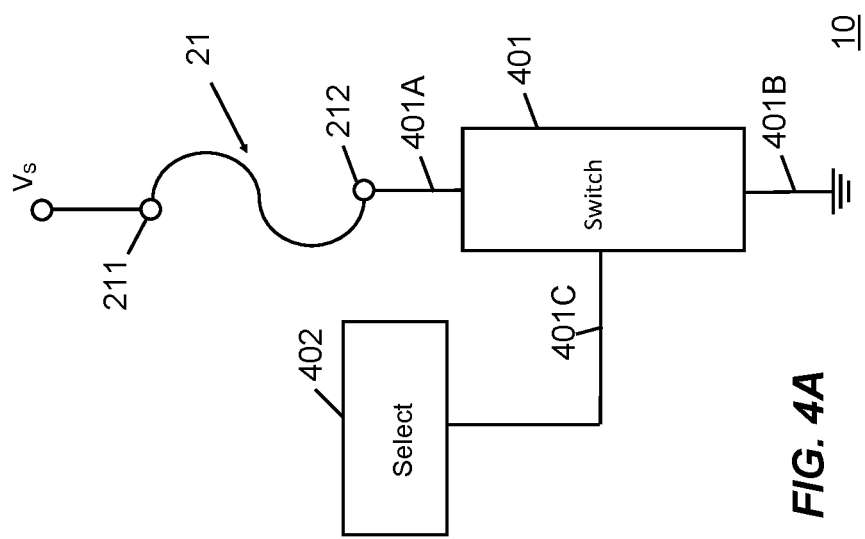
FIG. 4A is a schematic of a circuit incorporating a fuse structure of the present description.

FIG. 4A is a circuit schematic including fuse structure 21 in a bit fuse application including a switch 401 or controlling device 401 and a select device 402. Switch 401 includes a current carrying electrode 401A connected to fuse terminal 212 (e.g., cathode terminal) and a currently carrying electrode 401B connect to ground. A control electrode 401C is connected to a select device that when selected provides a signal to turn on switch 401. Fuse terminal 211 (e.g., anode terminal) is connected to a bias source (Vs) provided to bias fuse structure 21 during a programming operation. In some examples, switch 401 comprises a metal-oxide-semiconductor field effect transistor (MOSFET). In other examples, switch 410 comprises a bipolar transistor. In accordance with the present description, it was found in practice that configuring switch 401 so that the conductive pad region of current carrying electrode 401A has a large area with multiple substrate contacts to region of semiconductor material 11 is beneficial to provide both reduced electrical and thermal resistance to region of semiconductor material 11. This removes heat more efficiently/quickly from fuse structure 21 during programming to provide a quenching effect. In this way, resistance in the programming circuit is reduced so that most of the energy applied is to fuse structure 21.

FIG. 4B is a circuit schematic including fuse structure 21 in a bit fuse application including a switch 401 and select device 402. In this application fuse terminal 211 (e.g., anode terminal) is connected to current carrying electrode 401B of switch 401, and fuse terminal 212 (e.g., cathode terminal) is connected to ground. In this configuration, fuse terminal 211 can be connect to ground through a large area contact with multiple substrate contacts to region of semiconductor material 11 is beneficial to provide both reduced electrical and thermal resistance to region of semiconductor material 11. This removes heat more efficiently/quickly from fuse structure 21 during programming to provide a quenching effect. In this way, resistance in the programming circuit is reduced so that most of the energy applied is to fuse structure 21.

In summary, a semiconductor device and associated methods have been described that comprise a fuse structure with one or more auxiliary or dummy structures configured to reduce the effects of and/or to contain the results of defects, such as cracks and/or voids. In some examples, a fuse structure includes a pair of fuse terminals connective by a fuse body. The fuse body can comprise a semiconductor material and a silicide material. In some examples, an auxiliary structure, such as a dummy structure is disposed adjacent to but separated from the fuse body. In other examples, dummy structures are placed on opposing sides of the fuse body. In some examples, the dummy structures are disposed within a peripheral boundary defined by the fuse terminals. In further examples, a dummy structure is disposed to laterally overlap the fuse body and can be separated from the fuse body by a dielectric structure. In still further embodiments, one or more ends of the fuse body can include flared portions where the fuse body meets the fuse terminal(s). In other examples, at least a portions of the cathode fuse terminal is provided devoid of contact structures to enhance material migration/transfer during programming. In another example, a doped well structure is provided within a region of semiconductor material below at least the fuse body of the fuse structure. In addition, the well region can be disposed below at least portions of the fuse terminals. These features were observed through experimentation to reduce the presence of and/or reduce/contain the effects of cracks and voids thereby improving yields (e.g., reducing skew in resistance data) and reliability of semiconductor products using fuse structures, such as eFUSE structures.

While the subject matter of the invention is described with specific example steps and example embodiments, the foregoing drawings and descriptions thereof depict only typical examples of the subject matter and are not therefore to be considered limiting of its scope. Other examples and permutations are similarly envisioned. For instance, additional auxiliary structures can be added in other interconnect layers above and/or below the fuse structures. It is evident that many envisioned alternatives and variations such as those described will be apparent to those skilled in the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. A semiconductor device having a fuse structure, comprising:
    a region of semiconductor material having a first major surface;
    a first dielectric region over the first major surface;
    a fuse structure over the first dielectric region comprising:
        a first fuse terminal over a first part of the first dielectric region;
        a second fuse terminal over a second part of the first dielectric region and spaced apart from the first fuse terminal to provide a gap region; and
        a fuse body over a third part of the first dielectric region interposed between and connected to the first fuse terminal and the second fuse terminal;
    a first dummy structure over the first dielectric region in the gap region on a first side of the fuse body, the first dummy structure spaced apart and electrically isolated from the fuse body, the first fuse terminal, and the second fuse terminal; and
    a floating doped well region in the region of semiconductor material adjacent to the first major surface, wherein the fuse body and the first dummy structure are over the floating doped well region, wherein:
    the first fuse terminal has first fuse terminal first edges that are parallel to the fuse body;
    the first fuse terminal has a first fuse terminal second edge extending between the first fuse terminal first edges and connected to a first end of the fuse body;
    the second fuse terminal has second fuse terminal first edges that are parallel to the fuse body;
    the second fuse terminal has a second fuse terminal second edge extending between second fuse terminal first edges and connected to a second end of the fuse body;
    the first fuse terminal first edges, the first fuse terminal second edge, the second fuse terminal first edges, and the second fuse terminal second edge define a first perimeter for the gap region in a plan view;
    the floating doped well region defines a second perimeter in the plan view; and
    the first perimeter is inside the second perimeter.

2. The device of claim 1, further comprising:
    a second dummy structure over the first dielectric region in the gap region on a second side of the fuse body, the second dummy structure spaced apart and electrically isolated from the fuse body, the first fuse terminal, and the second fuse terminal, wherein:
the second dummy structure is inside the first perimeter.

3. The device of claim 1, wherein:
the first dummy structure comprises a rectangular shape and is spaced apart from the fuse body at an edge-to-edge spacing in a range from about 0.3 microns to about 0.7 microns.

4. The device of claim 1, wherein the fuse body comprises:
a semiconductor material; and
a silicide layer over the doped semiconductor material.

5. The device of claim 4, wherein:
the silicide layer comprises cobalt silicide, nickel silicide, or titanium silicide.

6. The device of claim 1, wherein the fuse body comprises:
a first fuse body end connected to the first fuse terminal;
a second fuse body end connected to the second fuse terminal; and
a first pair of flared portions disposed on opposite sides of the fuse body proximate to the first fuse body end so that the fuse body widens in a plan view proximate to where the fuse body connects to the first fuse terminal, and wherein:
the first fuse terminal second edge is perpendicular to the fuse body; and
the first pair of flared portions are connected to the first fuse terminal second edge at a location spaced part from the first fuse terminal first edges.

7. The device of claim 6, further comprising:
a second pair of flared portions disposed on opposite sides of the fuse body proximate to the second fuse body end so that the fuse body widens in the plan view proximate to where the fuse body connects to the second fuse terminal.

8. The device of claim 7, wherein:
each of the second pair of flared portions comprise a taper with respect to the fuse body of about 30 degrees to about 60 degrees.

9. The device of claim 6, wherein:
each of the first pair of flared portions comprise about a taper with respect to the fuse body of about 30 degrees to about 60 degrees.

10. The device of claim 1, further comprising:
a second dielectric region over the first fuse terminal, the fuse body, and the second fuse terminal;
first conductive vias disposed in the second dielectric region over the first fuse terminal and having a first via pattern; and
second conductive vias disposed in the second dielectric region over the second fuse terminal and having a second via pattern that is different than the first via pattern.

11. The device of claim 10, wherein:
the second fuse terminal second edge is perpendicular to the fuse body;
the second via pattern comprises an area devoid of vias proximate to where the fuse body connects to the second fuse terminal second edge; and
the second via pattern includes a via proximate to where the second fuse terminal second edge meets one of the second fuse terminal first edges.

12. The device of claim 1, wherein:
the first fuse terminal is electrically coupled to a switch provided as part of the region of semiconductor material.

13. The structure of claim 1, further comprising:
a second dielectric region over the fuse body and the first dummy structure; and
a second dummy structure over the second dielectric region in the gap region, the second dummy structure overlapping the fuse body, wherein:
the second dummy structure completely overlaps the first dummy structure in a plan view.

14. The structure of claim 1, further comprising:
a second dummy structure over the first dielectric region in the gap region on a second side of the fuse body, the second dummy structure spaced apart and electrically isolated from the fuse body, the first fuse terminal, and the second fuse terminal, wherein:
the first dummy structure and the second dummy structure are inside the first perimeter.

15. The device of claim 1, wherein the fuse body comprises:
a first fuse body end connected to the first fuse terminal;
a second fuse body end connected to the second fuse terminal;
a first pair of flared portions disposed on opposite sides of the fuse body proximate to the first fuse body end so that the fuse body widens in a plan view proximate to where the fuse body connects to the first fuse terminal; and
a second pair of flared portions disposed on opposite sides of the fuse body proximate to the second fuse body end so that the fuse body widens in the plan view proximate to where the fuse body connects to the second fuse terminal.

16. A semiconductor device having a fuse structure, comprising:
a region of semiconductor material having a first major surface;
a first dielectric over the first major surface;
a first fuse terminal over a first part of the first dielectric;
a second fuse terminal over a second part of the first dielectric and spaced apart from the first fuse terminal to provide a gap region;
a fuse body over a third part of the first dielectric interposed between and connected to the first fuse terminal and the second fuse terminal;
a first dummy structure in the gap region on a first side of the fuse body, the first dummy structure spaced apart and electrically isolated from the fuse body, the first fuse terminal, and the second fuse terminal;
a floating doped well region in the region of semiconductor material adjacent to the first major surface;
a second dielectric over the first fuse terminal, the fuse body, and the second fuse terminal;
first conductive vias disposed in the second dielectric over the first fuse terminal and having a first via pattern; and
second conductive vias disposed in the second dielectric over the second fuse terminal and having a second via pattern that is different than the first via pattern, wherein:
the second via pattern comprises an area devoid of vias proximate to where the fuse body connects to the second fuse terminal,
the first fuse terminal has first fuse terminal first edges that are parallel to the fuse body;

the first fuse terminal has a first fuse terminal second edge extending between the first fuse terminal first edges and connected to a first end of the fuse body;

the second fuse terminal has second fuse terminal first edges that are parallel to the fuse body;

the second fuse terminal has a second fuse terminal second edge extending between second fuse terminal first edges and connected to a second end of the fuse body;

the first fuse terminal first edges, the first fuse terminal second edge, the second fuse terminal first edges, and the second fuse terminal second edge define a first perimeter for the gap region in a plan view;

the first dummy structure and the fuse body are inside the first perimeter;

the floating doped well region defines a second perimeter in the plan view; and the first perimeter is inside the second perimeter.

* * * * *